(12) United States Patent
Kogler

(10) Patent No.: US 7,639,744 B1
(45) Date of Patent: Dec. 29, 2009

(54) PROGRAMMABLE DIGITAL BANDPASS FILTER FOR A CODEC CIRCUIT

(75) Inventor: Manfred Kogler, Villach (AT)

(73) Assignee: Infineon Technologies AG, Munich (DE)

( * ) Notice: Subject to any disclaimer, the term of this patent is extended or adjusted under 35 U.S.C. 154(b) by 544 days.

(21) Appl. No.: 10/018,976

(22) PCT Filed: Jun. 26, 2000

(86) PCT No.: PCT/DE00/02065

§ 371 (c)(1),
(2), (4) Date: Mar. 14, 2002

(87) PCT Pub. No.: WO01/01570

PCT Pub. Date: Jan. 4, 2001

(30) Foreign Application Priority Data

Jun. 25, 1999 (DE) ................................. 199 29 169

(51) Int. Cl.
*H04B 14/04* (2006.01)
(52) U.S. Cl. ................... 375/243; 375/244; 375/253; 375/254
(58) Field of Classification Search ................ 375/229, 375/232, 235, 233, 222, 242, 244, 241, 245, 375/246, 348, 254, 379, 347, 243, 212, 377; 455/295; 704/201, 223; 379/93.27, 93.28
See application file for complete search history.

(56) References Cited

U.S. PATENT DOCUMENTS

| 4,389,544 A | * | 6/1983 | Wagner et al. | ............... 370/294 |
| 4,591,827 A | * | 5/1986 | Nishita et al. | ................ 341/141 |
| 4,675,880 A | * | 6/1987 | Davarian | ..................... 375/261 |
| 4,766,589 A | * | 8/1988 | Fisher | ......................... 370/291 |
| 5,058,047 A | * | 10/1991 | Chung | ......................... 708/322 |
| 5,105,435 A | * | 4/1992 | Stilwell | ...................... 375/144 |
| 5,212,817 A | * | 5/1993 | Atkinson | .................. 455/161.2 |

(Continued)

FOREIGN PATENT DOCUMENTS

DE 197 38 226 C1 2/1999

(Continued)

OTHER PUBLICATIONS

Ali et al; "Optimum Codec Companding for High-Speed PCM Data transmission in Telephone Networks", IEEE, ICASSP Proceedings; Mar. 19, 1999; vol. 5, pp. 2679-2682.*

(Continued)

*Primary Examiner*—Chieh M Fan
*Assistant Examiner*—Qutbuddin Ghulamali
(74) *Attorney, Agent, or Firm*—Jenkins, Wilson, Taylor & Hunt, P.A.

(57) ABSTRACT

A codec circuit having a programmable digital bandpass filter is disclosed. According to one aspect, a bandpass filter matches the filter characteristics of the codec circuit to a transmitted pulse code modulation (PCM) signal. The codec circuit includes at least one programmable digital high-pass filter connected in series to at least one programmable digital low-pass filter. The setting filter characteristics for the programmable digital high-pass and low pass filters are each set by means of a signal identification device for identifying a PCM signal transmitted through the codec circuit. The filters are set as a function of the transmitted PCM signal in order to vary a bandpass filter characteristic for the programmable digital bandpass filter.

9 Claims, 4 Drawing Sheets

U.S. PATENT DOCUMENTS

| | | | | |
|---|---|---|---|---|
| 5,257,309 | A | * | 10/1993 | Brandman et al. .......... 379/283 |
| 5,341,417 | A | * | 8/1994 | Hwang et al. .......... 379/399.02 |
| 5,566,088 | A | * | 10/1996 | Herscher et al. ............ 702/123 |
| 5,610,943 | A | * | 3/1997 | Kakuishi et al. ............ 375/243 |
| 5,621,760 | A | * | 4/1997 | Gotoh et al. ................ 375/245 |
| 5,960,035 | A | * | 9/1999 | Sridhar et al. ............... 375/219 |
| 5,960,043 | A | * | 9/1999 | Lobo et al. .................. 375/316 |
| 6,006,189 | A | * | 12/1999 | Strawczynski et al. ...... 704/270 |
| 6,052,412 | A | * | 4/2000 | Ruether et al. .............. 375/231 |
| 6,078,609 | A | * | 6/2000 | Nago ........................... 375/132 |
| 6,226,608 | B1 | * | 5/2001 | Fielder et al. ............... 704/229 |
| 6,341,360 | B1 | * | 1/2002 | Abdelilah et al. ........... 714/704 |
| 6,389,069 | B1 | * | 5/2002 | Mathe ........................ 375/232 |
| 6,504,865 | B1 | * | 1/2003 | Liang et al. .................. 375/222 |
| 6,744,812 | B2 | * | 6/2004 | Anne et al. .................. 375/222 |
| 6,944,219 | B2 | * | 9/2005 | Mathe ........................ 375/232 |

FOREIGN PATENT DOCUMENTS

| | | |
|---|---|---|
| EP | 0 322 060 A2 | 6/1989 |
| EP | 0 597 201 A1 | 5/1994 |
| EP | 0 620 641 A1 | 10/1994 |
| EP | 0 703 564 A1 | 3/1996 |

OTHER PUBLICATIONS

Tietze et al., "Halbleiter-Schaltungstechnik," Springer-Verlag Berlin (Germany), pp. 825-829, 846-847 (1990).

Garth D. Hillman, "DSP56200: An Algorithm-Specific Digital Signal Processor Peripheral," Proceedings of the IEEE, vol. 75 (No. 9), p. 1185-1191, (Sep. 1987).

* cited by examiner

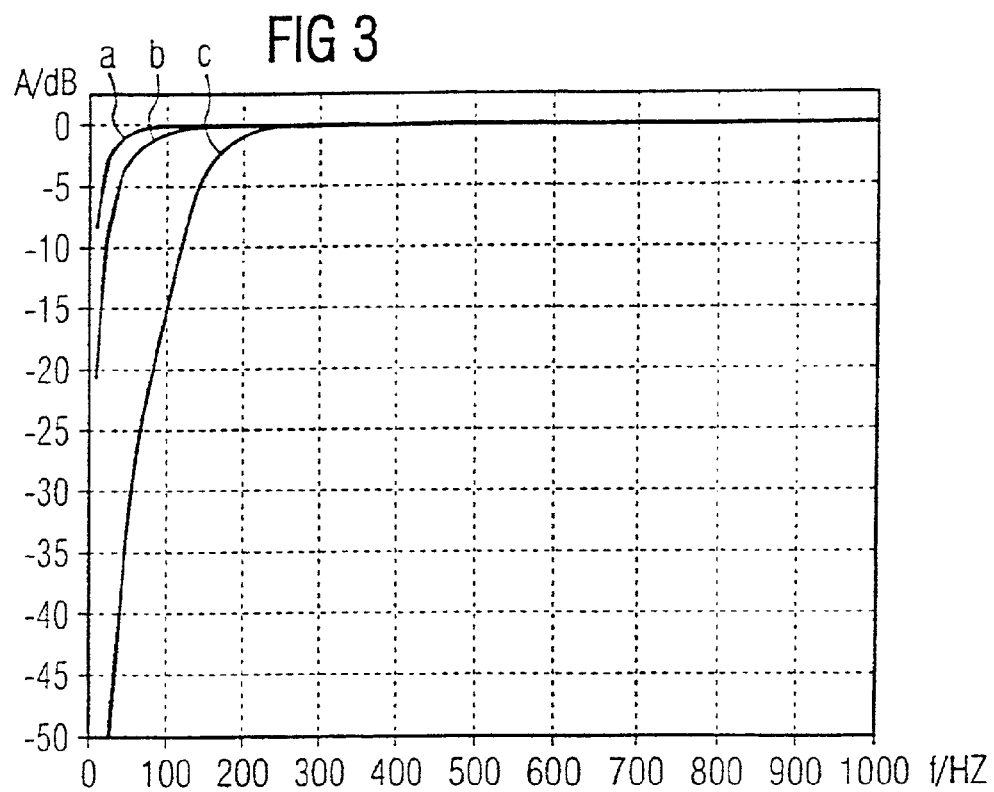
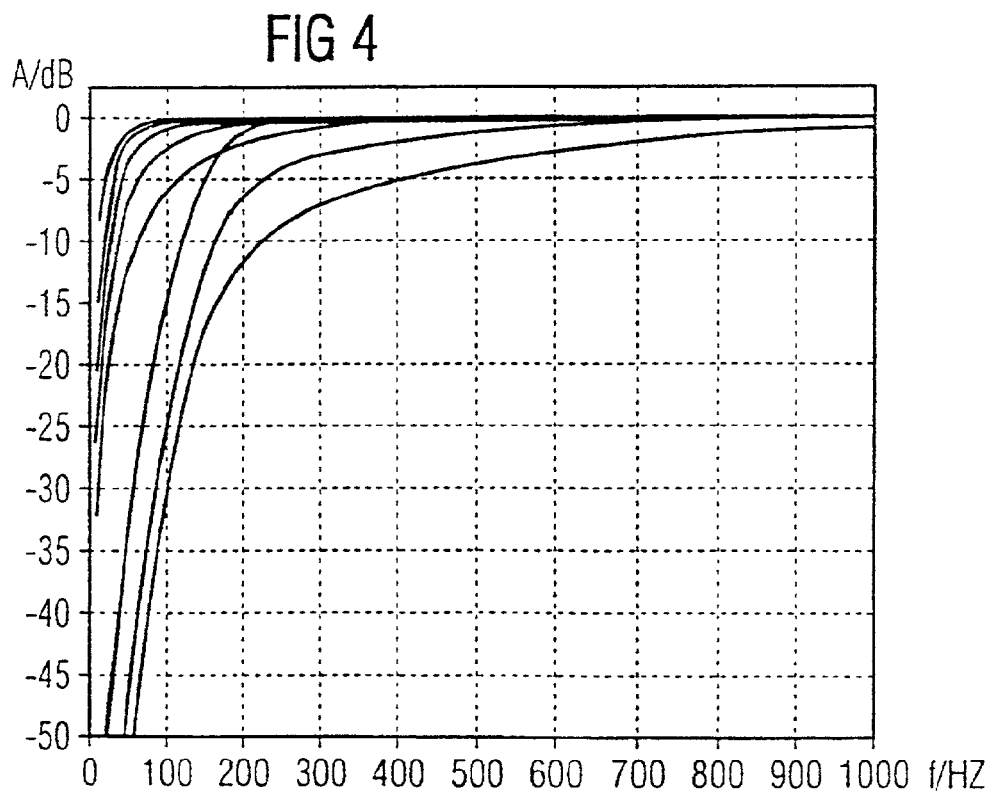

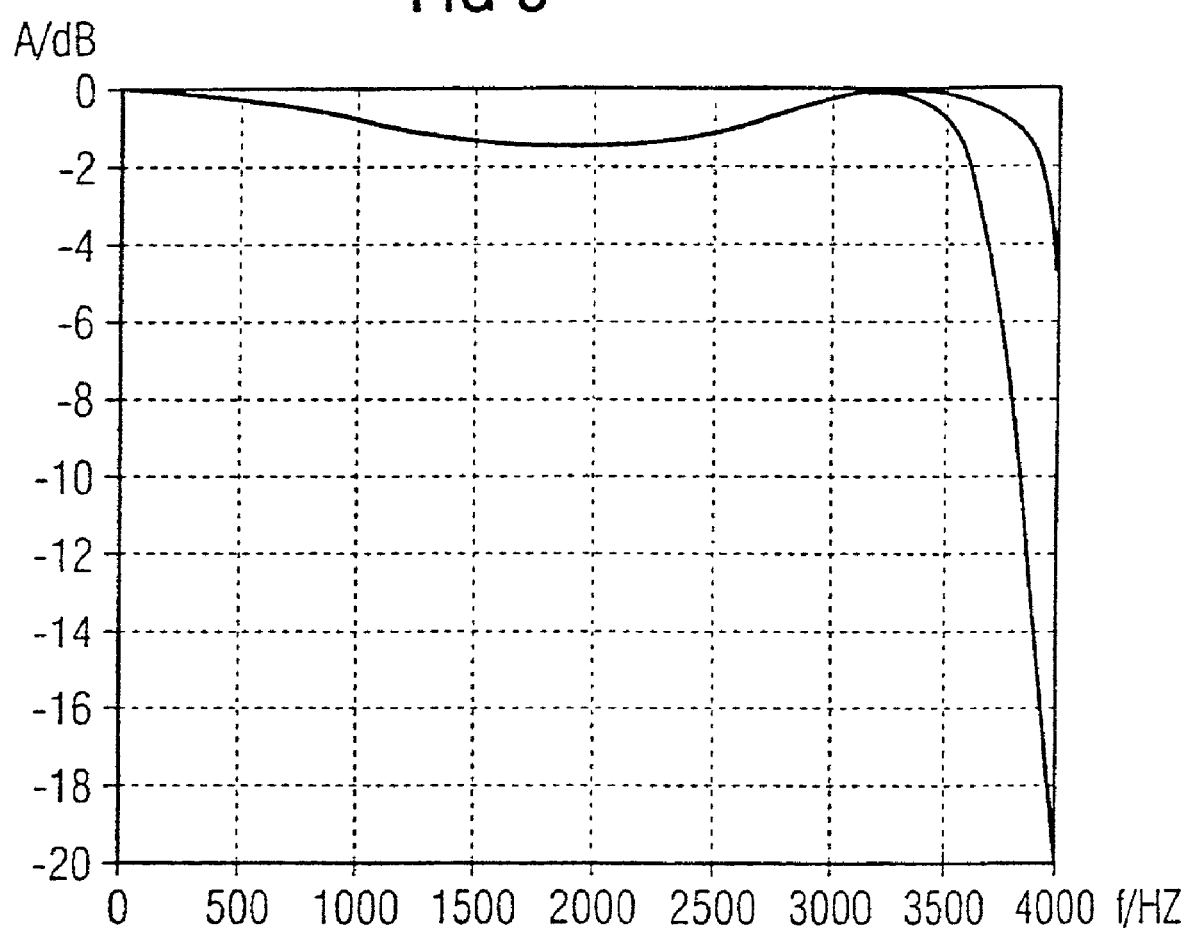

PROGRAMMABLE DIGITAL BANDPASS FILTER FOR A CODEC CIRCUIT

BACKGROUND OF THE INVENTION

1. Field of the Invention

The present invention relates to a codec circuit having a programmable digital bandpass filter for matching the filter characteristics of the codec circuit to a transmitted PCM signal.

2. Description of Related Art

U.S. Pat. No. 5,212,817 discloses a programmable digital bandpass filter for a codec circuit for adaptation of the filter characteristics, in which case the setting filter coefficients can be set by changing the bandpass filter characteristic of the programmable digital bandpass filter.

A codec circuit is a circuit which intrinsically combines the functions of a coding switching device and a decoding switching device. When transmitting information, information is in many cases transmitted in both directions between two connections. In this situation, the codec circuit would carry out PCM (Pulse Code Modulation) signal coding in the transmission direction and PCM signal decoding in the reception direction.

In practice, codec circuits are normally in the form of digital signal processors (DSP), which are highly specialized, but nevertheless standardized, integrated circuits produced in large quantities for high-speed processing of a narrowly constrained set of input signals in real time. Digital signal processors such as these are typically used for data transmission by means of modems. A modem is a terminal which modulates outgoing signals and demodulates received signals.

For signal transmission of voice signals, the filter characteristics of the codec circuit have to comply with specific, predetermined specifications. There are no such specifications for the filter characteristics for signal transmission of modem signals.

Since the transmission rate of modems is directly proportional to the transmission frequency bandwidth, the data transmission rate increases with increasing frequency bandwidth of the digital filters integrated in the codec circuit. The digital filters which have been used in known codec circuits until now have filter characteristics matched to the specifications which exist for transmission of voice signals, and are not programmable. It is thus impossible when using such digital filters for codec circuits according to the prior art to widen the filter bandwidth, or to reset it, for data transmission when modem signals are being transmitted from a first modem to a second modem instead of the normal voice signals which originate, for example, from a telephone.

BRIEF SUMMARY OF THE INVENTION

The object of the present invention is thus to provide a codec circuit, in which the data transmission frequency range can be matched to the transmitted PCM signal.

According to the invention, this object is achieved by a programmable digital bandpass filter having the features specified in patent claim 1.

Further advantageous refinements are specified in the dependent claims. The invention is in this case based on the idea of providing the programmable digital bandpass filter in addition to the digital filters with fixed settings in the codec circuit, in order that the filter bandwidth, and hence the data transmission rate, can be matched to the transmitted PCM signal.

In one advantageous refinement of the codec circuit according to the invention, the setting filter coefficients can be stored in coefficient memory devices, which are associated with the digital high-pass filter and the digital low-pass filter.

This offers the particular advantage that the coefficients of the digital filters can be matched to or reprogrammed for technical requirements of the transmission channel and to and for the transmitted PCM signal at any time.

In a further advantageous refinement, the memory devices are random access memories (RAMs).

The memory devices are preferably connected via coefficient setting lines to a signal identification device for identification of the PCM signal transmitted through the codec circuit.

This offers the particular advantage that the setting of the setting filter coefficients, and hence the matching of the filter characteristics of the codec circuit to the transmitted PCM signal, can be carried out automatically by identifying the nature of the transmitted PCM signal, without any need for manual programming for each specific case. The programmable digital filters are preferably seventh-order filters.

In one preferred embodiment, the upper and the lower signal transmission cut-off frequencies for the digital bandpass filter and the gradient of the bandpass filter flanks can be set separately by means of the setting filter coefficients.

This offers the particular advantage that the two signal transmission cut-off frequencies of the bandpass filter can be set independently of one another. Furthermore, the gradient of the bandpass filter flanks can be programmed in accordance with the requirements for the transmission channel.

The lower signal transmission cut-off frequency of the bandpass filter can preferably be set by setting the setting filter coefficients of the digital high-pass filter.

The upper signal transmission cut-off frequency of the bandpass filter can preferably be set by setting the setting filter coefficients of the digital low-pass filter. In one preferred embodiment, a frequency response correction filter is also connected in series with the digital low-pass filter and the digital high-pass filter in order to compensate for the ripple in the frequency passband of the bandpass filter.

This offers the particular advantage that the transmitted PCM signal is filtered uniformly, independently of the frequency, throughout the frequency passband of the bandpass filter.

BRIEF DESCRIPTION OF THE SEVERAL VIEWS OF THE DRAWINGS

One preferred embodiment of a codec circuit is described in the following text, in order to explain the features that are essential to the invention, with reference to the attached drawings, in which:

FIG. 3 shows a typical filter characteristic of a codec circuit as a function of the filters that are used in the transmission signal path of the codec circuit;

FIG. 4 shows a filter transmission characteristic of a codec circuit in the region of the lower cut-off frequency for various filter coefficient settings;

FIG. 5 shows a filter transmission characteristic of a codec circuit in the region of the upper cut-off frequency.

DETAILED DESCRIPTION OF THE INVENTION

Figure 1:
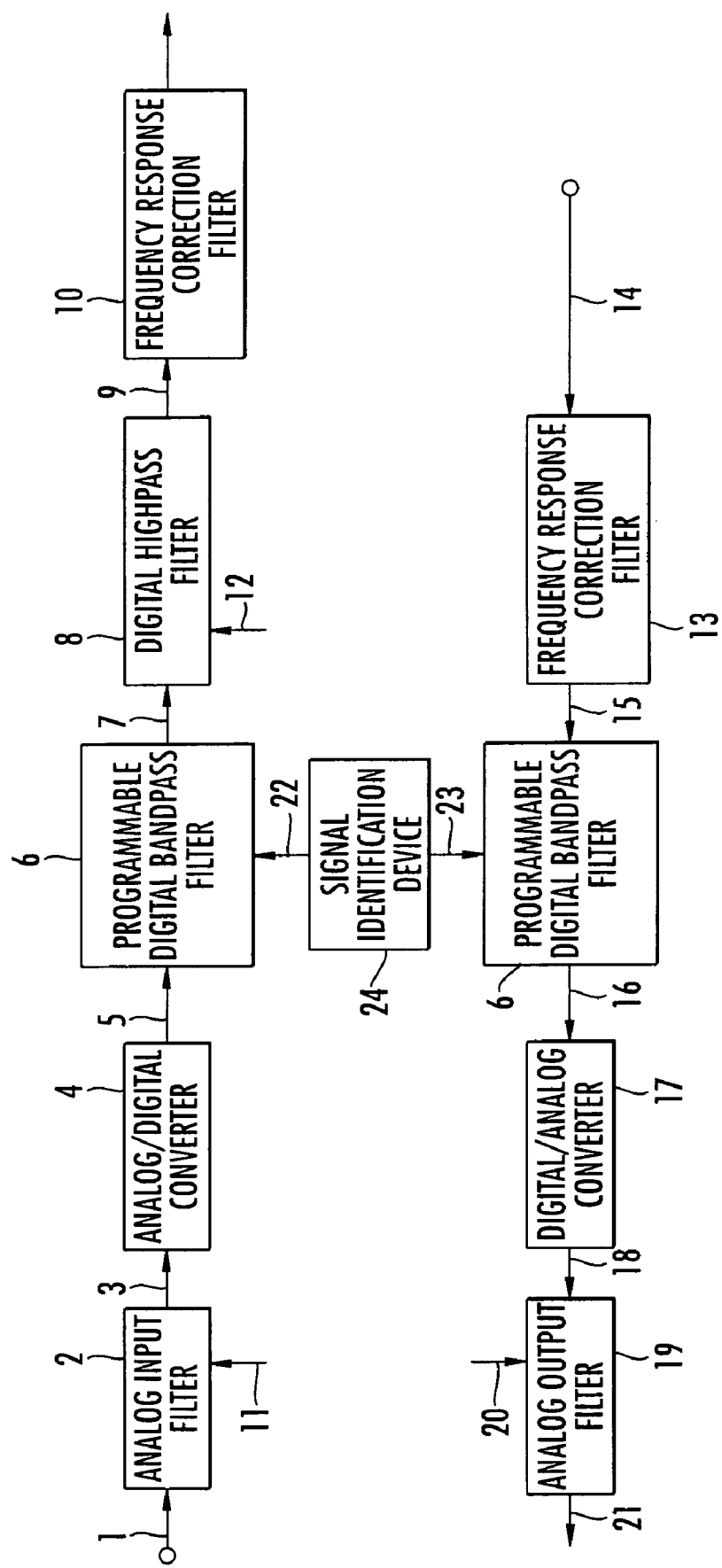
FIG. 1 shows a codec circuit, in which programmable digital bandpass filters according to the invention are used both in the transmission signal path and in the reception signal path of the codec circuit.

FIG. 1 shows a block diagram of a codec circuit, in which a transmission signal is PCM-coded and a received PCM signal is decoded. The codec circuit has a transmission signal path and a reception signal path for this purpose.

The analog input filter is preferably an analog high-pass filter for outputting alternating signals. On the output side, the analog input filter 2 is connected via a line 3 to an analog/digital converter 4. The analog/digital converter 4 samples the filtered analog signal supplied to it via the line 3, and produces a digital output signal, which is passed via the line 5 to the programmable digital bandpass filter 6 according to the invention. The digital bandpass filter 6 has a bandpass filter characteristic and filters the digital signal applied on the line 5 such that only signals in the frequency passband of the bandpass filter are passed via a line 7 to a digital high-pass filter 8. The digital high-pass filter has a high-pass filter characteristic which is permanently set and cannot be varied.

On the output side, the digital high-pass filter 8 is connected via a line 9 to a frequency response correction filter 10. The frequency response correction filter 10 compensates for ripple in the passband of the bandpass filter characteristic.

The transmission signal path in the codec circuit is formed, as is shown in FIG. 1, by the analog input filter 2, the analog/digital converter 4, the programmable digital bandpass filter 6, the digital high-pass filter 8, whose setting is fixed, and by the frequency response correction filter 10. In this case, the analog input filter 2 and the digital high-pass filter 8, whose setting is fixed, can be connected via control lines 11, 12 to the transmission signal path of the codec circuit. If the input filter 2 is switched off via the control line 11, the signal which is applied on the input line 1 is passed directly, without being filtered, to the input of the analog/digital converter 4. If the digital high-pass filter 8 is switched off via the control line 12, the output signal from the programmable digital bandpass filter 6 is passed directly to the frequency response correction filter 10.

The reception signal path of the codec circuit illustrated in FIG. 1 likewise has a frequency response correction filter 13, whose input side is connected to a receiving line 14. The design of the frequency response correction filter 13 is similar to that of the frequency response correction filter 10. According to the invention, a line 15 connects a programmable digital bandpass filter 6 which is connected in the reception signal path of the codec circuit, to the frequency response connection filter 13. The output signal, having been filtered by the programmable digital bandpass filter 6, is supplied via a line 16 to a digital/analog converter 17, which converts the received digital signal to an analog signal, and preferably emits this signal via a line 18 to an analog output filter 19. In one preferred embodiment, the analog output filter 19 can be connected to the reception signal path of the codec circuit, via a control line 20. The output signal from the output filter 19 is emitted via an output line 21 to, for example, an SLIC circuit, which is not illustrated.

The two programmable digital bandpass filters in the codec circuit for matching the filter characteristics of the codec circuit to the PCM signal transmitted in the transmission signal path or the reception signal path can be controlled by a signal identification device 24, via control lines 22, 23, in the preferred embodiment illustrated in FIG. 1.

The signal identification device 24 identifies the PCM signal transmitted through the codec circuit. The signal identification device 24 is connected via detection lines (which are not illustrated) to the transmission signal path and/or to the reception signal path of the codec circuit. An evaluation circuit, which is integrated in the signal identification device 24, is used to evaluate and to identify the PCM signal in the transmission signal path or the reception signal path. The evaluation circuit identifies the type of modulation and the transmission speed such that, firstly, it is possible to determine whether the transmitted PCM signal originates from a terminal, for example a modem, or from a telephone for voice transmission. Furthermore, the evaluation circuit identifies the type of transmitting or receiving modem. For example, the evaluation circuit identifies whether the transmitting modem is a V.90 modem or a V.34 modem. The signal identification device 24 sets the optimum digital filter coefficients for the digital bandpass filters, via the control lines 22, 23, to match the identified modem. In this case, the filter coefficients are preferably set automatically.

Figure 2:
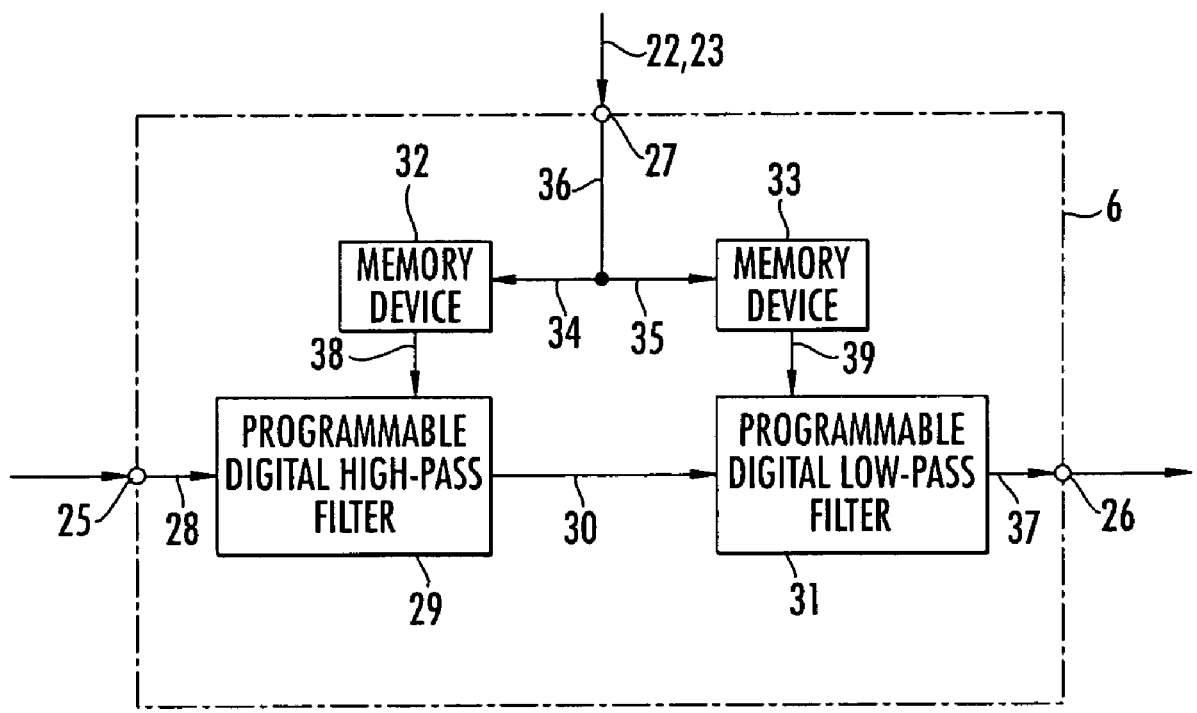
FIG. 2 shows a block diagram of the codec circuit according to the invention.

FIG. 2 shows the programmable digital bandpass filter, as illustrated in FIG. 1, according to the invention, in detail.

The programmable digital bandpass filter 6 has an input connection 25, an output connection 26 and a control or setting connection 27. The control connection 27 is connected via a control line 22 or 23 to the signal identification device 24 shown in FIG. 1. The input connection 25 is connected via an internal input line 28 to a programmable digital high-pass filter 29. The programmable digital high-pass filter 29 is connected in series with a programmable digital low-pass filter 34 via a line 30. The setting filter coefficients of the programmable digital high-pass filter 29 can be stored in an associated memory device 32. The setting filter coefficients of the programmable digital low-pass filter 31 can be stored in an associated memory device 33. The memory devices 32, 33 are preferably random access memories (RAMs). The setting filter coefficients stored there can be reprogrammed by the signal identification device 24. To do this, the memory devices 32, 33 are connected to the control connection 27 via internal memory setting lines 34, 35, 36.

The programmable digital low-pass filter 31 is connected on the output side via an internal output line 37 to the output connection 26 of the programmable digital bandpass filter 6.

In the embodiment shown in FIG. 2, the programmable digital low-pass filter 31 is connected downstream from the programmable digital high-pass filter 29. In an alternative embodiment, the programmable digital high-pass filter 29 is connected downstream from the programmable digital low-pass filter 31.

In further embodiments of the programmable digital bandpass filter according to the invention, a large number of programmable digital high-pass filters 29 and a large number of programmable digital low-pass filters 31 can be connected in series. The programmable digital low-pass filters 31 may in this case at the same time be in the form of interpolation and decimation filters.

In one preferred embodiment of the programmable digital bandpass filter 6 according to the invention, the programmable digital filters 29, 31 are seventh-order filters.

The setting filter coefficients which can be stored in the memory devices 32, 33 set the filter characteristics of the digital filters 29, 31 via lines 38, 39.

A bandpass filter characteristic is achieved by connecting the programmable digital high-pass filter 29 and a programmable digital low-pass filter 31 in series. The setting coefficients in this case make it possible to set the upper and the lower signal transmission cut-off frequencies of the digital bandpass filter 6 according to the invention and the gradient of the bandpass filter flanks independently of one another. However, the programmable digital bandpass filter according to the invention can be set in a flexible manner to satisfy the individual requirements of the transmission channel and the type of modem being used.

In this case, the lower cut-off frequency of the bandpass filter characteristic can be set by setting the setting filter coefficients of the digital high-pass filter 29, and the upper signal transmission cut-off frequency of the bandpass filter characteristic can be set by setting the setting filter coefficients of the digital low-pass filter 31.

In one preferred embodiment, the frequency response correction filters 10, 13, as are shown in FIG. 1, are integrated in the programmable digital bandpass filter 6, with the compensation for the ripple in the bandpass filter characteristic being carried out automatically as a function of the filter coefficient settings.

FIG. 3 shows the frequency response characteristic of the codec circuit shown in FIG. 1, in the region of the lower cut-off frequency. As can be seen from FIG. 3, the lower cut-off frequency occurs at about 100 to 200 Hz.

The filter transmission curve a shows a filter characteristic of the codec circuit when only the input filter 2 is switched on, corresponding to the switch-on control signal supplied via the control line 11. The filter transmission curve b shows the situation when the digital high-pass filter 8, whose setting is fixed, is also connected in the transmission signal path of the codec circuit, by means of a control signal on the control line 12. Finally, the filter transmission curve c shows the situation in which the programmable digital high-pass filter 29 in the programmable digital bandpass filter 6 according to the invention is also connected in the transmission signal path of the codec circuit. The digital programmable bandpass filter 6 is preferably connected in the signal transmission path automatically by the signal identification device 24 on identifying a corresponding PCM signal via a separate control line.

As can be seen from FIG. 3, the lower cut-off frequency of the codec circuit is increased by the addition of the digital bandpass filter 6 according to the invention, and occurs at about 200 Hz. The lower cut-off frequency of the codec circuit can thus be set individually as a function of the transmitted PCM signal. In the example shown in FIG. 3, the cut-off frequency is set in the range from 50 Hz to 200 Hz.

FIG. 4 shows the filter transmission characteristic of the codec circuit shown in FIG. 1 when the various high-pass filters are added, that is to say the analog input filter 2, the digital programmable high-pass filter 29 within the digital programmable bandpass filter, and the fixed digital high-pass filter 8. In this case, in contrast to FIG. 3, FIG. 4 also shows the filter characteristic being changed as a function of the filter coefficient. As can be seen from FIG. 4, not only is the lower signal transmission cut-off frequency of the codec circuit but also the gradient of the lower bandpass filter flank, as well. This allows fine adjustment of the codec circuit.

FIG. 5 shows the filter transmission characteristic of the digital programmable low-pass filter 31 within the programmable digital bandpass filter 6. As can be seen from FIG. 5, switching the digital programmable low-pass filter 31 to different filter coefficients reduces the upper cut-off frequency.

As can be seen from FIGS. 3 to 5, the addition of the programmable digital bandpass filter 6 reduces the frequency passband, since the lower cut-off frequency is increased and the upper cut-off frequency is decreased. Conversely, the frequency passband is widened, and the data transmission rate thus increased, by changing the coefficients of the programmable digital bandpass filter 6.

The filter transmission characteristic can be programmed differently in the transmission signal path and in the reception signal path of the codec circuit. For example, if a V.90 modem is used, the transmission direction can be matched to V.34 modem transmission by means of a higher upper cut-off frequency in the digital programmable high-pass filter 29 in the programmable digital bandpass filter 6 connected in the reception signal path, while the full frequency bandwidth is available in the reception direction. Use of the programmable digital bandpass filter 6 according to the invention within the codec circuit makes it possible to utilize the frequency range as far as possible, particularly for terminals and modems. The programmable digital bandpass filter 6 according to the invention furthermore offers the capability to program the cut-off frequencies independently of one another.

It is thus possible firstly to satisfy the predetermined specifications for voice transmission, and secondly to achieve optimum utilization of the frequency range for modem signal transmissions.

What is claimed is:

1. A codec circuit having a programmable digital bandpass filter, for matching the filter characteristics of the codec circuit to a transmitted Pulse Code Modulation (PCM) signal, having at least one programmable digital high-pass filter and at least one programmable digital low-pass filter connected in series, and a signal identification device configured to identify a type of modulation and transmission speed of a PCM signal transmitted within the codec circuit to determine the transmitted PCM signal originates from a terminal or from a telephone and configured to set filter coefficients for the at least one programmable digital high-pass filter and the at least one programmable digital low-pass filter based on the identified type of modulation and transmission speed of the transmitted PCM signal to vary a bandpass filter characteristic for the programmable digital bandpass filter to match the determined origin of the transmitted PCM signal.

2. The codec circuit as claimed in claim 1, wherein the setting filter coefficients are stored in coefficient memory devices which are associated with the programmable digital high-pass and low-pass filters.

3. The codec circuit as claimed in claim 2, wherein the memory devices are random access memories (RAM).

4. The codec circuit as claimed in claim 2, wherein the memory devices are connected via coefficient setting lines to the signal identification device.

5. The codec circuit as claimed in claim 1, wherein the programmable digital filters are each seventh-order filters.

6. The codec circuit as claimed in claim 1, wherein the upper and lower signal transmission cut-off frequencies of the bandpass filter and the gradient of bandpass filter flanks are set by means of the setting filter coefficients.

7. The codec circuit as claimed in claim 6, wherein the lower signal transmission cut-off frequency is set by setting the setting filter coefficients of the digital high-pass filter.

8. The codec circuit as claimed in claim 6, wherein the upper signal transmission cut-off frequency is set by setting the setting filter coefficients of the programmable digital low-pass filter.

9. The codec circuit as claimed in claim 1, wherein a frequency response correction filter is also provided, in order to compensate for the ripple in the bandpass filter characteristic in the passband.

\* \* \* \* \*

UNITED STATES PATENT AND TRADEMARK OFFICE
CERTIFICATE OF CORRECTION

| | | |
|---|---|---|
| PATENT NO. | : 7,639,744 B1 | Page 1 of 1 |
| APPLICATION NO. | : 10/018976 | |
| DATED | : December 29, 2009 | |
| INVENTOR(S) | : Manfred Kogler | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1013 days.

Signed and Sealed this

Ninth Day of November, 2010

David J. Kappos
*Director of the United States Patent and Trademark Office*